United States Patent
Talwalkar

(10) Patent No.: US 7,015,768 B1
(45) Date of Patent: Mar. 21, 2006

(54) LOW NOISE VOLTAGE-CONTROLLED OSCILLATOR

(75) Inventor: Niranjan Talwalkar, San Jose, CA (US)

(73) Assignee: IRF Semiconductor, Inc., Cupertino, CA (US)

( * ) Notice: Subject to any disclaimer, the term of this patent is extended or adjusted under 35 U.S.C. 154(b) by 22 days.

(21) Appl. No.: 10/927,901

(22) Filed: Aug. 27, 2004

Related U.S. Application Data

(60) Provisional application No. 60/498,578, filed on Aug. 29, 2003.

(51) Int. Cl.
  *H03B 5/12* (2006.01)
  *H03B 5/24* (2006.01)
  *H03B 5/36* (2006.01)

(52) U.S. Cl. ............... 331/177 V; 331/57; 331/117 R; 331/117 FE; 331/158

(58) Field of Classification Search ............... 331/36 C, 331/57, 116 R, 116 FE, 117 R, 117 FE, 117 D, 331/158, 177 R, 177 V
See application file for complete search history.

(56) References Cited

U.S. PATENT DOCUMENTS

| | | | |
|---|---|---|---|
| 6,292,065 B1 * | 9/2001 | Friedman et al. | ....... 331/117 R |
| 6,348,841 B1 * | 2/2002 | See | ....................... 311/167 |
| 6,504,443 B1 * | 1/2003 | Eguizabal | ............... 331/177 V |
| 6,566,971 B1 | 5/2003 | Gutierrez | |
| 6,930,562 B1 * | 8/2005 | Takinami et al. | ........ 331/117 R |

OTHER PUBLICATIONS

Li Lin et al; "A 1.4GHz Differential Low-Noise CMOS Frequency Synthesizer using a Wideband PLL Architecture"; 2000 IEEE International Solid-State Circuits Conference; 3 pages.*

Ainspan et al., A Comparison of MOS Varactors in Fully-Integrated CMOS LC VCO's at 5 and 7 GHz, IBM T.J. Watson Research Center.

Levantino et al., "Frequency Dependence on Bias Current in 5-Ghz CMOS VCOs: Impact on Tuning Range and Flicker Noise Upconversion", IEEE Journal of Solid-State Circuits, vol. 37, No. 8, pp. 1003-1011, Aug. 2002.

Hajimiri et al., "Design Issues in CMOS Differential LC Oscillators", IEEE Journal of Solid-State Circuits, vol. 34, No. 5, pp. 717-724, May 1999.

* cited by examiner

*Primary Examiner*—David Mis
(74) *Attorney, Agent, or Firm*—Fish & Richardson P.C.

(57) ABSTRACT

A low-phase-noise and high-performance voltage-controlled oscillator (VCO) uses a noise-canceling differential varactor topology. An implementation includes circuitry for a fully-differential varactor-inductor oscillator for reduced noise and improved performance. Susceptibility to common-mode noise sources coupled into the varactors is reduced.

39 Claims, 4 Drawing Sheets

LOW NOISE VOLTAGE-CONTROLLED OSCILLATOR

CROSS-REFERENCE TO RELATED APPLICATIONS

This application claims priority to U.S. Provisional Ser. No. 60/498,578, filed Aug. 29, 2003, which is incorporated by reference in its entirety.

TECHNICAL FIELD

The present disclosure relates to circuitry, such as voltage-controlled oscillators, for wireline and wireless communications.

BACKGROUND

The growing demand for wireless communications has motivated attempts to design radios that permit the integration of multiple circuit components onto a single chip to reduce overall cost, size, and power consumption. For example, a radio receiver and a radio transmitter can be integrated onto a single chip. Recent advances in CMOS semiconductor processing and scaling can facilitate the component integration.

One circuit component that can be integrated with other components on a chip is a voltage-controlled oscillator (VCO) circuit. The VCO can be found in various communication applications, such as in cellular communications. The VCO is one of the building blocks of a phase-locked loop (PLL). In one implementation, a PLL refers to a negative-feedback control system in which the phase of a VCO or phase shifter is brought into alignment, or to a predefined static phase offset, with respect to the phase of a periodic reference signal. In this implementation, the PLL can have a reference port for the input reference signal and a feedback port to couple to the output of the VCO. The PLL can compare the phase of the periodic reference signal and the feedback signal, and vary the phase and frequency of the output of the PLL until the reference and feedback signals are phase and frequency matched.

SUMMARY

One aspect of the present disclosure describes a method for providing common-mode noise rejection in a voltage controlled oscillator (VCO). The method involves applying a first input control tuning signal to a first node. The first node is shared between a first pair of varactors, in which each of the first pair of varactors has a positive terminal and a negative terminal, and at least one of the terminals represents an external node. Each of the first pair of varactors is connected in series with their respective positive terminals at the first node. The method includes applying a second input control tuning signal to a second node. The second node is shared between a second pair of varactors, and each of the second pair of varactors has a positive terminal and a negative terminal, and at least one of the terminals represents an external node. Each of the second pair of varactors is connected in series with their respective negative terminals at the second node. The first pair of varactors is connected in parallel with the second pair of varactors, and the external nodes of the first and second pairs of varactors are the negative terminals of the first pair of varactors and the positive terminals of the second pair of varactors. The method also includes applying a common mode signal to the external nodes of the first and second pairs of varactors using at least one passive element.

The internal nodes may include the node shared between each pair of varactors. The parallel connection may include connecting the negative terminal of a first varactor from the first pair of varactors to the positive terminal of a first varactor from the second pair of varactors, and connecting the positive terminal of a second varactor from the first pair of varactors to the positive terminal of a second varactor from the second pair of varactors. The common mode signal can be controlled by a third input tuning control signal, and the first, second, and/or third input tuning control signals are operable to tune the VCO.

The method may also include coupling an LC tank, ring oscillator, or a reference crystal oscillator to the first and second pair of varactors with coupling capacitors. The coupling capacitors can be used to block low-frequency noise. The method may also involve connecting an active driver circuit. The passive element may include a resistor network with at least two serially-connected resistors, and the common mode signal can be applied at a node common to both resistors. The passive element may also be an inductor. The VCO can be a fully-differential architecture.

The differential input control signals can include the first input control tuning signal and the second input control tuning signal, and at least one of the varactors or at least one of the passive elements can be implemented in MOS or metal-semiconductor field effect transistor (MESFET) process technology.

Also described is an implementation in which a voltage controlled oscillator (VCO) apparatus includes a first pair of varactors connected together at a positive terminal of each of the first pair of varactors, and a second pair of varactors connected together at a negative terminal of each of the second pair of varactors. The second pair of varactors is connected in parallel with the first pair of varactors. The VCO apparatus includes a first input control tuning signal at the positive terminal of each of the first pair of varactors, and a second input control tuning signal at the negative terminal of each of the second pair of varactors. The VCO apparatus also has at least two passive elements serially connected together, in which the passive elements include a common-mode reference for the first and second input tuning control signals, and the passive elements are connected in parallel with the first and second pairs of varactors.

The VCO apparatus may also include a tuning tank circuit connected in parallel with the first and second pairs of varactors, an active circuit connected in parallel with the tuning tank circuit, and a pair of coupling capacitors to differentially couple the first and second pair of varactors to the tuning tank circuit. The tuning tank circuit can be an inductor-capacitor (LC) circuit, a ring oscillator, or a reference crystal oscillator. The coupling capacitors may be metal-insulator-metal (MIM) capacitors and/or may block low-frequency noise.

The parallel connection can include a first connection for a negative terminal of a first varactor from the first pair of varactors to a positive terminal of a first varactor from the second pair of varactors, and a second connection for a positive terminal of a second varactor from the first pair of varactors to a positive terminal of a second varactor from the second pair of varactors. A terminal for a first passive element from the at least two passive elements can be connected to the first connection, and a terminal for a second passive element from the passive elements can be connected to the second connection. The first and second connections can include different connections from any of a first node connecting the serially-connected passive elements, a second node connecting the first pair of varactors, and a third node connecting the second pair of varactors. The common mode reference can include a third input control tuning signal.

The VCO apparatus can be differential, and may provide common-mode noise rejection and/or noise cancellation. For example, the VCO apparatus may cancel the noise on the nodes that are connected between the first pair of varactors and the second pair of varactors. Each varactor may receive half of a differential voltage signal to reduce VCO sensitivity (Kvco).

Another implementation involves a system with a voltage controlled oscillator (VCO) that includes a differential varactor topology. The differential varactor topology includes a first pair of serially-connected varactors and a second pair of serially-connected varactors. The first pair of varactors is connected at a positive terminal of each varactor, and the second pair of varactors is connected at a negative terminal of each varactor. A negative terminal of each of the first pair of varactors is connected to a positive terminal of each of the second pair of varactors. The VCO also includes a passive network to receive a common mode signal related to a first input tuning control signal applied to the positive connection at the first pair of varactors and to a second input tuning signal applied to the negative connection at the second pair of varactors. The VCO has an oscillator device that is capacitively-coupled to the negative terminal of each of the first pair of varactors and the positive terminal of each of the second pair of varactors. The VCO also includes an active circuit connected to the oscillator device.

The oscillator device can be an inductor-capacitor (LC) tank, a ring oscillator, or a reference crystal oscillator. The connections of the first and second pairs of varactors may provide common-mode noise rejection. The capacitive coupling may provide blocking of low frequency noise.

The first input tuning control signal and the second input tuning control signal can be a differential signal. In one aspect, the VCO may be part of a phase-locked loop (PLL) circuit. In another aspect, the VCO can be implemented in CMOS technology. The varactors can be implemented using metal-oxide semiconductor (MOS) or metal-semiconductor field effect transistor MESFET structures.

One aspect of the present disclosure relates to a low-noise, high-performance voltage-controlled oscillator (VCO) that employs a noise-canceling differential varactor topology. The VCO can be used in phase-locked loop (PLL) frequency synthesizers. The PLL frequency synthesizer can be used in a number of applications, such as radio-frequency (RF) receivers and transmitters for communication standards including cellular communications (e.g., 2.5G/3G/4G standards) and wireless communications standards (e.g., 802.11-type standards). The PLL frequency synthesizers can also be used for optical fiber communications, network communications, and storage systems.

Another aspect of the present disclosure relates to a high-performance VCO design with low phase noise and reduced VCO sensitivity, Kvco. VCO sensitivity, Kvco, can refer to the ratio of the VCO output frequency to a tuning control signal. The varactor topology can be applicable for both single-ended and differential control signals. The VCO has a low susceptibility to common-mode noise sources coupled from the environment to the varactors including, but not limited to, those on the control signals. The VCO can reject common-mode noise and reduce low-frequency noise coupling into/from the VCO's inductor-capacitor (LC) tank circuit.

The details of one or more implementations are set forth in the accompanying drawings and the description herein. Other features and advantages will be apparent from the description and drawings, and from the claims.

DETAILED DESCRIPTION

Figure 1:
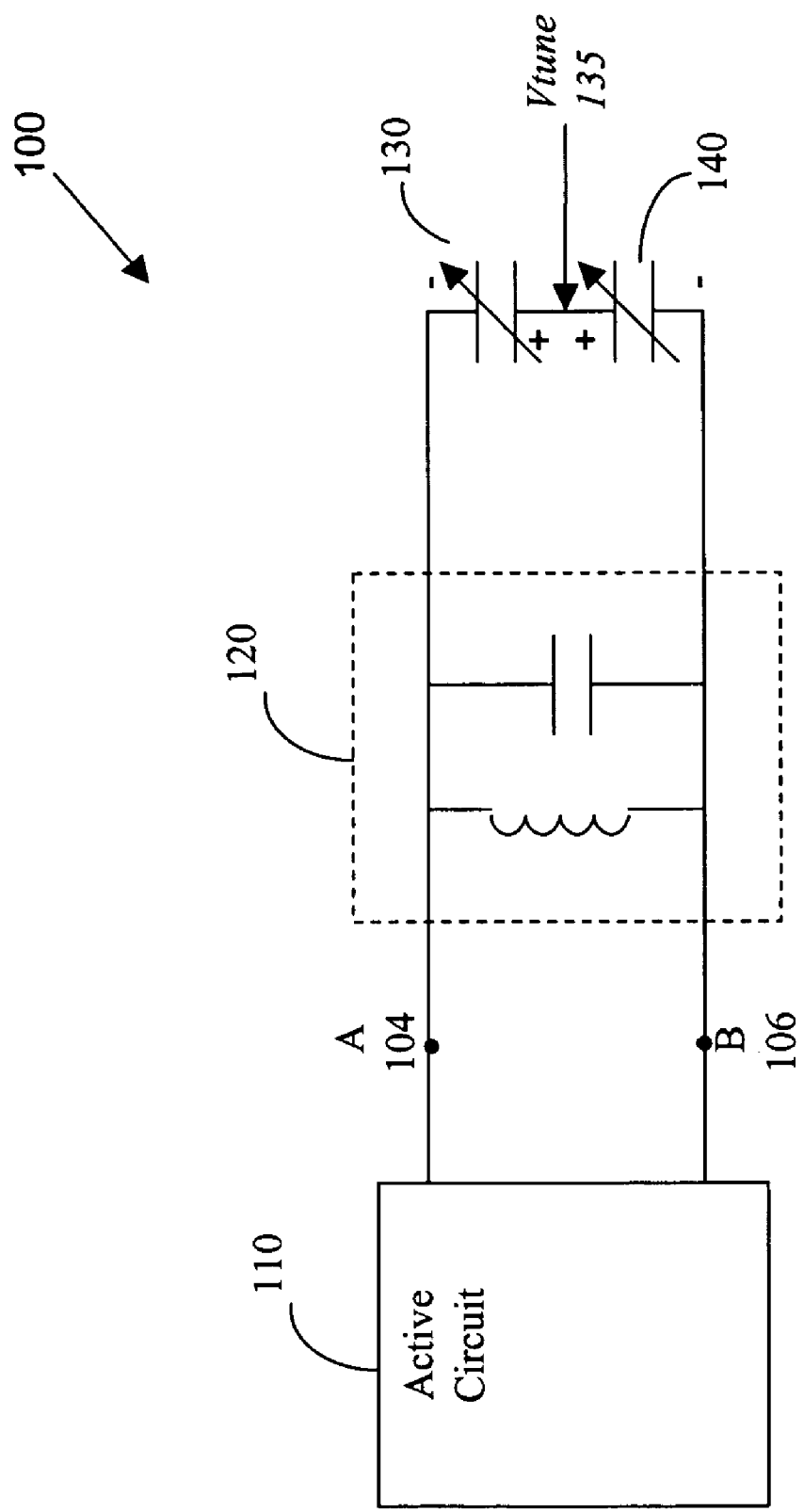
FIG. 1 shows an exemplary circuit diagram of a conventional VCO.

FIG. 1 shows an exemplary circuit diagram 100 of a conventional VCO with a single-ended input tuning control signal, Vtune 135. The VCO has an active circuit (or driver) 110 as a gain element with two output terminals, A (104) and B (106), an inductor-capacitor (LC) tank circuit 120, and varactors (e.g., voltage-controlled capacitors) 130, 140, connected in series. The LC tank 120 and the serial varactors 130, 140 are connected in parallel across terminals A (104) and B (106). The input tuning control signal, Vtune 135, is connected between the two varactors 130,140.

The VCO can play a role in determining the overall noise performance of the PLL. For example, external noise on the input tuning control signal to the VCO can degrade the PLL performance. So, if the VCO input tuning control signal is susceptible to noise interference, then the performance of the PLL can be degraded. Among the components in the PLL, the VCO characteristics can dominate the out-of-band PLL noise performance. Another factor that can be responsible for PLL performance is the VCO sensitivity, Kvco, which refers to the ratio of the VCO output frequency to the input tuning control signal. Lower values of Kvco can provide better PLL noise performance.

Because a single-ended signal can be more susceptible to noise interference than a double-ended signal, the single-ended VCO shown in FIG. 1 can degrade the performance of the PLL. The noise on the output terminals A (104) and B (106) can further degrade the varactors' and the VCO's performance and noise contribution to the PLL. The noise sources may include digital noise that is coupled from the substrate into the VCO.

Figure 2:
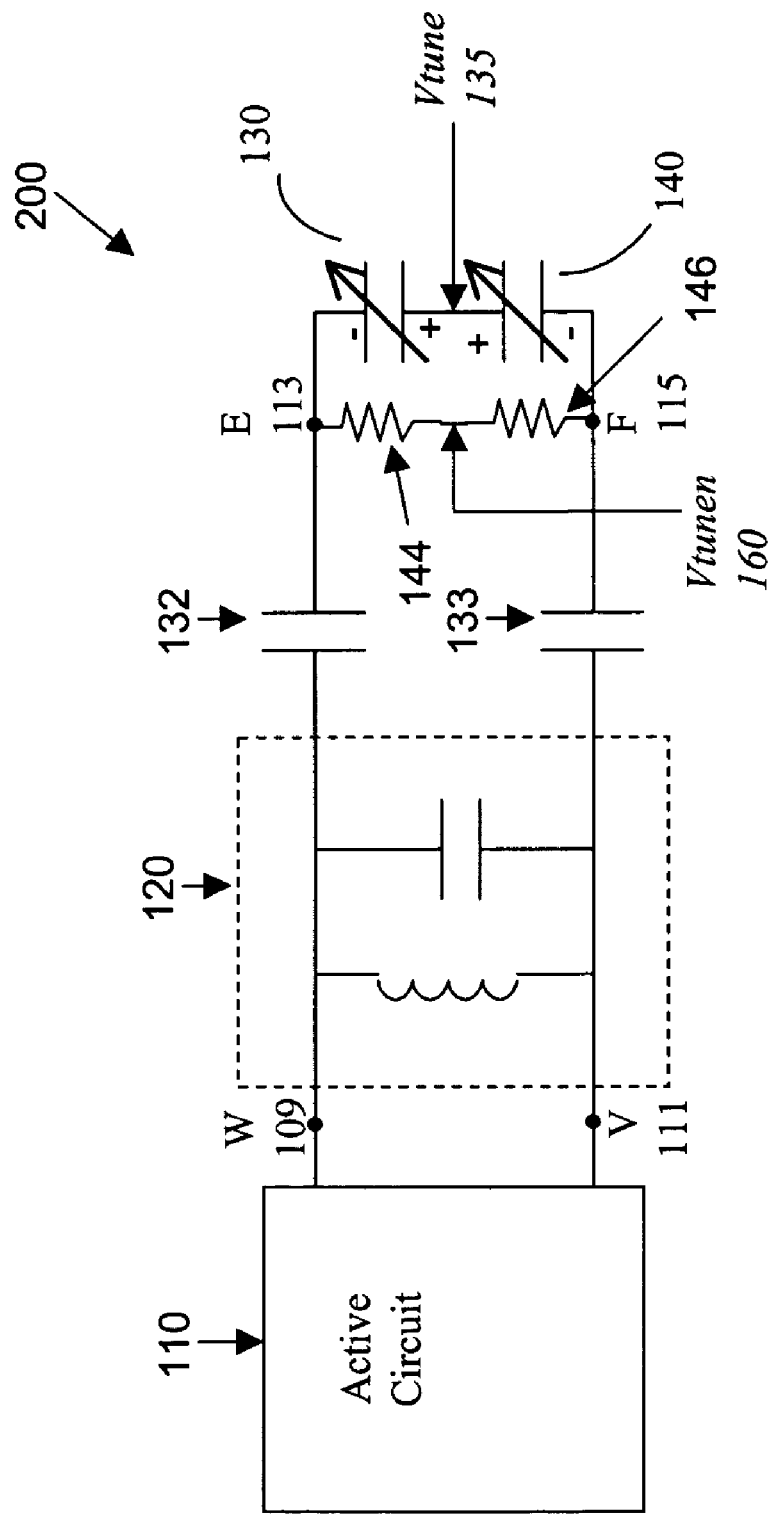
FIG. 2 shows an exemplary diagram of a conventional varactor design.

FIG. 2 shows a conventional differential design 200 of a differential VCO. The VCO uses differential input tuning control signals Vtune 135 and Vtunen 160 to tune the LC tank circuit and to reduce the sensitivity contributed by Vtune. The varactors 130, 140 are connected in series with Vtune 135 applied at the node between the varactors. Resistors 144, 146 are connected in series with Vtunen 160 applied at a node between the resistors. Capacitors 132, 133 act as a bridge between terminals W (109), V (111), and E (113), F (115). Terminals W (109) and V (111) are the differential outputs. The design 200 is differential in the sense that differential voltages are used to reduce Kvco. The VCO has an active circuit (or driver) 110 as a gain element with two output terminals, W (109) and V (111), and an inductor-capacitor (LC) tank circuit 120.

In this differential design 200, the varactors and the VCO can be susceptible to common-mode noise at terminals W (109), V (111), and at terminals E (113), F (115). As a result, the differential design 200 is not capable of rejecting all common-mode sources of noise because both varactors 130, 140 are affected in cases of common mode noise. For example, the voltages across both varactors 130, 140 may increase if there is common-mode noise. As a result, both varactors 130, 140 can respond similarly by lowering their respective capacitance values. The changes in the capacitance values can result in spurious tones in the VCO output spectrum and/or can result in phase noise. As a result, the design 200 can be more susceptible to common-mode noise.

The resistors 144, 146 can introduce another noise source, thermal noise, into the VCO. So, the design 200 may be susceptible to common-mode noise from the resistors and from digital noise sources.

Figure 3:
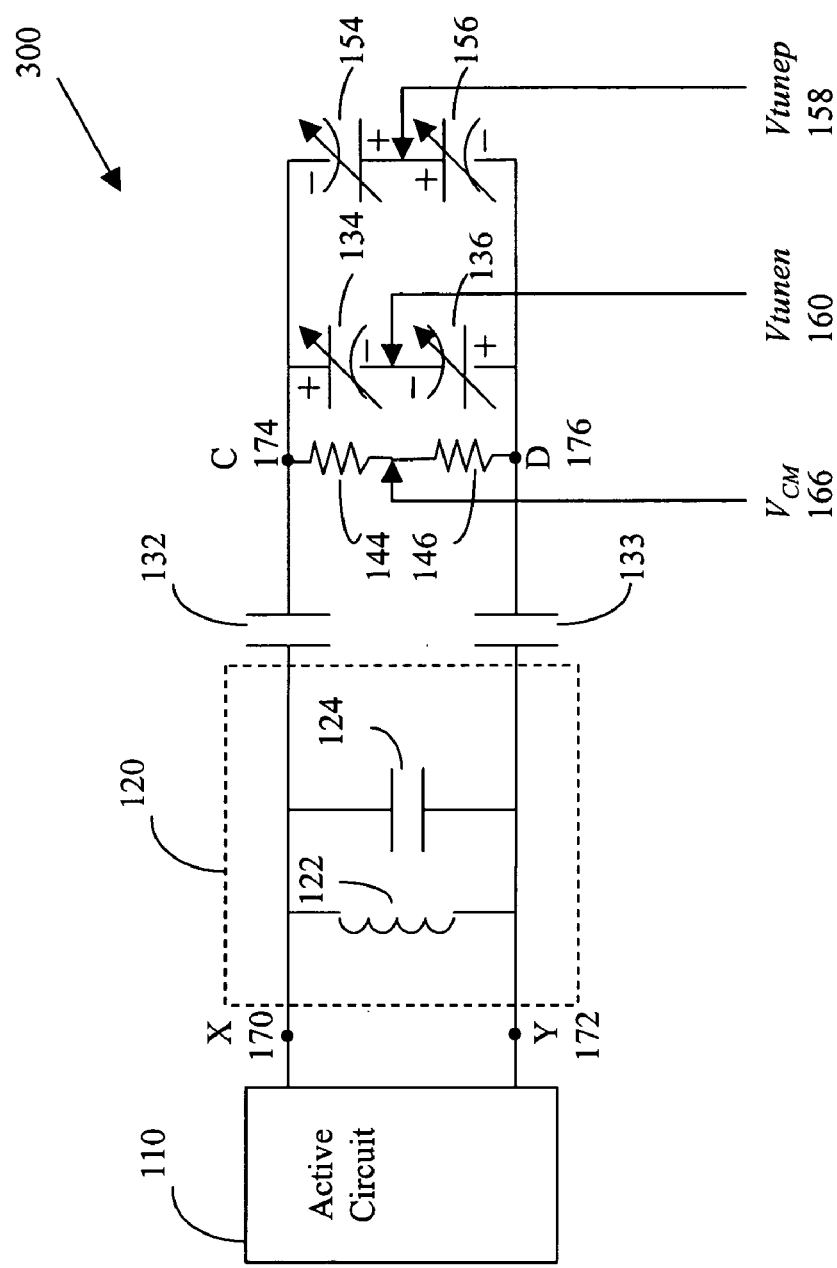
FIG. 3 shows an exemplary circuit diagram of a high-performance, low-noise VCO design.

FIG. 3 shows an exemplary circuit schematic 300 of a high-performance, low-noise VCO. The VCO design includes an active circuit 110 with two terminals X (170) and Y (172), an inductor-capacitor LC-tank circuit 120, a first capacitor 132, a second capacitor 133, a first resistor 144, a second resistor 146, a first varactor 154, a second varactor 156, a third varactor 134, and a fourth varactor 136. The LC-tank circuit 120 includes a capacitor 124, and an inductor 122. In one implementation, all of the varactors 134, 136, 154, 156 should have substantially the same value which may achieve optimal performance.

The various circuit elements are connected in the following manner. The LC-tank circuit 120 is connected across terminals X (170) and Y (172) of the active circuit 110. The two resistors 144, 146 are connected in series. Two of the varactors 154, 156 are connected in series with their respective positive terminals connected to each other. The other two varactors 134, 136 are connected in series with their respective negative terminal connected to each other. The two serial resistors 144, 146, the two serially-connected varactors 154, 156 and the other two serially-connected varactors 134, 136 are connected in parallel to form external nodes C (174) and D (176). The first capacitor 132 is connected between node C (174) and terminal X (170), and the second capacitor 133 is connected between node D (176) and terminal Y (172). Differential input control signals, Vtunep 158 and Vtunen 160 are applied at the nodes between one set of serially-connected varactors 154, 156 and the other set of serially-connected varactors 134 and 136 respectively, to provide tuning of the LC-tank circuit 120. An auxiliary control signal, $V_{CM}$ 166, representing the common-mode voltage level of Vtunep 158 and Vtunen 160, is applied at a node between the serially-connected resistors 174, 176.

The two capacitors 132, 133 are coupled between nodes of the LC-tank circuit 120, nodes X (170) and Y (172), and external nodes of each pair of varactors, nodes C (174) and D (176), respectively. The capacitors 132, 133 can block DC current going into the LC-tank circuit 120 from nodes C (174) and D (176). Hence, the four varactors 154, 156, 134, 136 are effectively AC-coupled to the LC-tank circuit 120. The two coupled capacitors 132, 133 can serve to block noise originating from the active circuit 110 at low frequencies from affecting varactors 134, 136, 154, and 156. The noise that can be blocked includes thermal noise from the resistors 144, 146, and/or digital noise that is coupled into the active circuit 110 from the substrate.

Because DC current does not flow into the LC-tank circuit 120, this circuit configuration can allow both terminals 174, 176 of the four varactors 154, 156, 134, 136, to be connected to an arbitrary DC voltage potential. The differential input tuning control signals, Vtunep 158 and Vtunen 160, can also have an arbitrary DC voltage potential. The VCO 300 can thus be controlled in a fully differential manner to provide significantly improved noise performance when compared to single-ended VCO designs and/or designs (i.e., single-ended or differential) without common-mode noise rejection. Differential input tuning control signals can ensure overall reduced susceptibility to noise coupling into the input tuning control signal 158, 160.

Because the positive terminal of varactor 134 is connected to the negative terminal of varactor 154, the thermal noise of resistor 144 can affect varactors 154, 134 in an equal and opposite manner to effectively cancel and reject common-mode noise sources, such as the thermal noise contribution of the resistors and digital noise sources. For instance, because the two varactors 154, 134 effectively are in parallel with each other in a differential operation, the VCO can provide common-mode rejection for noise, and the impact of the thermal noise contribution of the resistor 144 is minimized for the VCO. Similar noise cancellation can be obtained for the thermal noise of resistor 146, by varactors 156 and 136. Differential and common-mode noise on the terminals X (170) and Y (172) can similarly be minimized by this noise cancellation technique.

Because only half of the differential voltage signal is applied across each varactor in this implementation for a fixed range of tuning frequencies, the $K_{VCO}$ value can be one half of the $K_{VCO}$ value of conventional single-ended designs.

In another exemplary implementation, a low-phase noise and high-performance differential varactor structure includes at least two pairs of varactors. Each varactor pair can have a positive and a negative terminal such that increasing the voltage at the positive node increases the capacitance and increasing the voltage at the negative node decreases the capacitance. Two of the varactors can be connected in series with their positive polarity terminals connected to each other, thus forming two external nodes and one internal node. The other two varactors can be connected in series with their negative polarity terminals connected to each other, thus forming two external nodes and one internal node. The two pairs of the serially-connected varactors can be connected in parallel to form a differential varactor structure with two external terminals and two internal nodes. A pair of differential input tuning control signals can be applied to the respective middle nodes of the two serially-connected varactor pairs with the common-mode level signal applied to the two terminals of the differential varactor structure via passive elements such as, but not limited to, a pair of resistors. Other passive elements used with the varactor structure may include other components such as inductors.

In another implementation, a high-performance differential VCO design includes an LC-tank circuit with two terminals, two capacitors, and the varactor structure described herein with two pairs of serially-connected varactors in parallel. One capacitor can couple one of the external nodes of the varactor structure to one of two terminals of the LC-tank. The other capacitor can couple the other external node of the varactor structure to the second terminal of the LC-tank. A pair of differential input tuning control signals can be applied to the respective middle nodes of the two serially-connected varactor pairs, with the common-mode level signal applied to the two external terminals of the differential varactor structure via passive elements, such as a pair of resistors or inductors.

Another implementation may involve a differential VCO design that includes an LC-tank circuit, multiple differential varactors (e.g., 2 pairs of varactors), each having a positive and a negative terminal, and multiple capacitors. The capacitors can couple the LC-tank circuit to the multiple differential varactors. A single-ended input control signal, a fixed reference signal, and common-mode levels of the control and reference signals are applied across the varactors to tune the LC-tank circuit to generate an appropriate oscillator output. The control signals 158, 160, 166 may be part of a phase-locked loop (PLL) design for use in a PLL frequency synthesizer.

Figure 4:
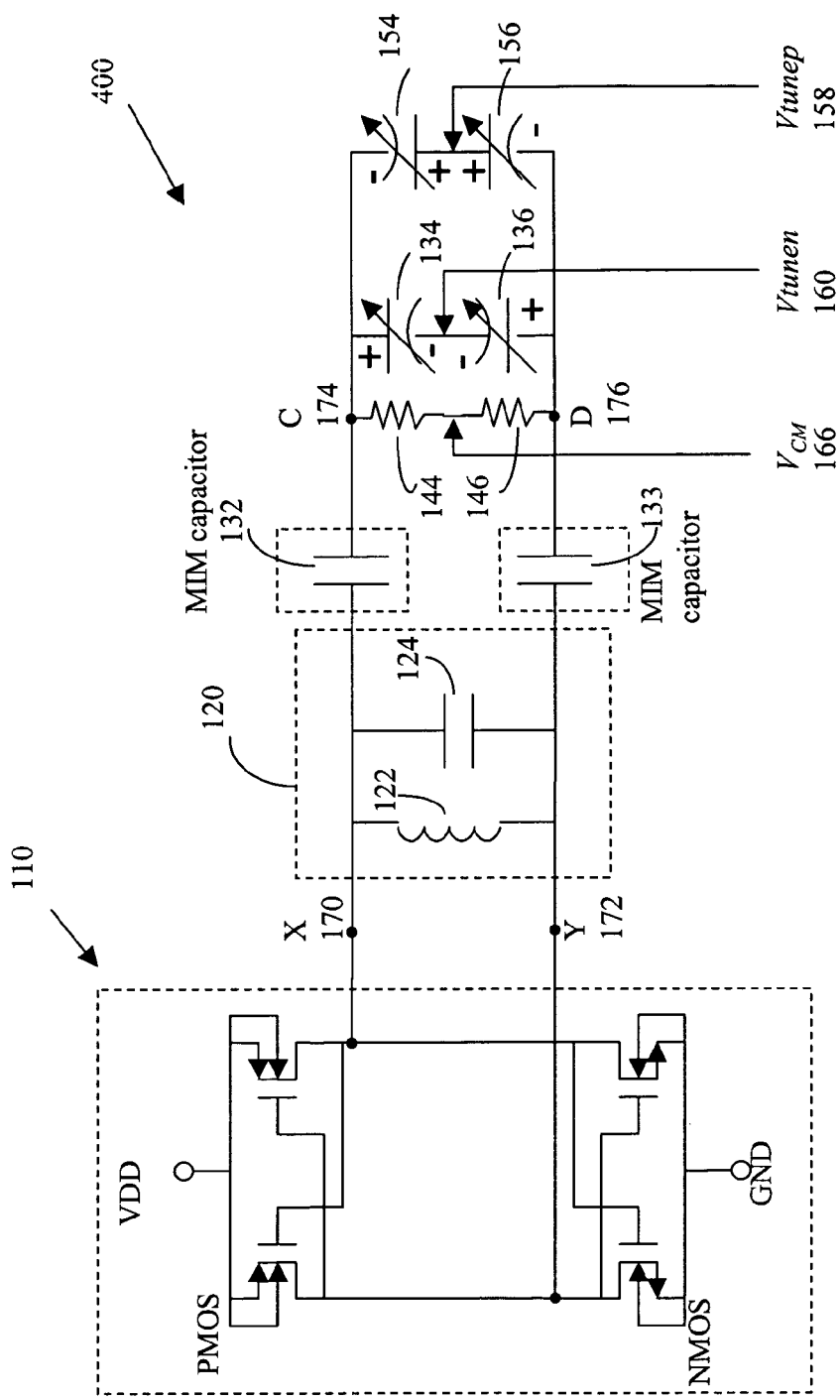
FIG. 4 shows an exemplary circuit diagram of the design of FIG. 3.

FIG. 4 is an exemplary circuit schematic 400 using CMOS technology for the exemplary circuit schematic 300 shown in FIG. 3. In one implementation, the four varactors 154, 156, 134, 136 are implemented by the gate-oxide of an MOS transistor structure inside a well region. With a given a p-type silicon substrate, for example, the MOS varactors can be constructed of a polysilicon-oxide-silicon sandwich inside an n-well (e.g., a layer of polysilicon on a layer of oxide on a layer of silicon in an n-well). The gate of the MOS varactors can be implemented using polysilicon. The four varactors 154, 156, 134, 136 can also be implemented using several other components, process technologies, and structures including, but not limited to, implementations using pn-junctions, metal-oxide-semiconductor (MOS) structures, and/or metal-semiconductor field effect transistor (MESFET)-based varactors.

Each of the AC-coupled capacitors 132, 133 can have a fixed capacitance value and can be implemented by a number of different capacitor structures including, but not limited to, a MOS capacitor, a polysilicon-insulator-polysilicon layered capacitor, or a metal-insulator-metal (MIM) layered capacitor.

Modifications may be made to the inventions disclosed herein without departing from the scope and spirit. The inventions illustratively described herein suitably may be practiced in the absence of any element or elements, limitation or limitations that are not specifically disclosed herein. The terms and expressions which have been employed are used as terms of description and not of limitation, and there is no intention that in the use of such terms and expressions of excluding any equivalents of the features shown and described or portions thereof, but it is recognized that various modifications are possible within the scope of the claims. Thus, it should be understood that specific embodiments and optional features have been disclosed, modification and variation of the concepts herein disclosed may be employed, and that such modifications and variations may be within the scope of the appended claims.

Among other modifications that may be made, for example, one or more other types of active circuits 110 can be used in FIG. 4, such as a gain-producing active circuit and/or a latch-type circuit. In another implementation, the varactors can be implemented as pn-junction diodes. The VCO can be implemented in a monolithic semiconductor integrated circuit. The exemplary design shown in FIG. 4 is not limited to CMOS process technology, but may also use other process technologies, such as BiCMOS (Bipolar-CMOS) process technology, or Silicon Germanium (SiGe) technology. For example, one or more elements of the design of FIG. 4, such as inductor 122, capacitor 124, MIM (coupling) capacitors 132, 132, resistors 144, 146, and devices in the active circuit 110, are not limited to being implemented in a CMOS process technology. In another aspect, other types of oscillators can be used when tuning frequencies other than LC-type oscillators. For example, the other types of oscillators can include ring oscillators and reference crystal oscillators. The ring oscillators can be used in delay-locked loops (DLLs), and the reference crystal oscillators can be used as a reference clock in various digital circuits. Accordingly, other implementations are within the scope of the following claims.

What is claimed is:

1. A method for providing common-mode noise rejection in a voltage controlled oscillator (VCO), the method comprising:
   applying a first input control tuning signal to a first node, wherein the first node is shared between a first pair of varactors, each of the first pair of varactors having a positive terminal and a negative terminal, wherein at least one of the terminals represents an external node, and each of the first pair of varactors being connected in series with their respective positive terminals at the first node;
   applying a second input control tuning signal to a second node, wherein the second node is shared between a second pair of varactors, each of the second pair of varactors having a positive terminal and a negative terminal, wherein at least one of the terminals represents an external node, each of the second pair of varactors being connected in series with their respective negative terminals at the second node, wherein the first pair of varactors is connected in parallel with the second pair of varactors, and wherein external nodes of the first and second pairs of varactors comprise the negative terminal of each of the first pair of varactors and the positive terminal of each of the second pair of varactors; and
   applying a common mode signal to the external nodes of the first and second pairs of varactors using at least one passive element.

2. The method of claim 1, wherein the internal nodes comprise the node shared between each pair of varactors.

3. The method of claim 1, wherein the parallel connection comprises:
   connecting the negative terminal of a first varactor from the first pair of varactors to the positive terminal of a first varactor from the second pair of varactors; and
   connecting the positive terminal of a second varactor from the first pair of varactors to the positive terminal of a second varactor from the second pair of varactors.

4. The method of claim 1, wherein the common mode signal is controlled by a third input tuning control signal, and wherein any of the first, second, and third input tuning control signals are operable to tune the VCO.

5. The method of claim 4, further comprising coupling an LC tank to the first and second pair of varactors with coupling capacitors.

6. The method of claim 5, further comprising using the coupling capacitors to block low frequency noise.

7. The method of claim 5, further comprising connecting an active driver circuit to the LC tank.

8. The method of claim 7, wherein the passive element comprises a resistor network with at least two serially-connected resistors.

9. The method of claim 4, further comprising coupling any of a ring oscillator and a reference crystal oscillator to the first and second pair of varactors with coupling capacitors.

10. The method of claim 9, further comprising using the coupling capacitors to block low frequency noise.

11. The method of claim 9, further comprising connecting an active driver circuit to the ring oscillator or the reference crystal oscillator.

12. The method of claim 11, wherein the passive element comprises a resistor network with at least two serially-connected resistors.

13. The method of claim 1, wherein the common mode signal is applied at a node common to both resistors.

14. The method of claim 13, wherein the VCO is a fully differential architecture.

15. The method of claim 1, wherein the passive element comprises an inductor.

16. The method of claim 1, wherein differential input control signals comprise the first input control tuning signal and the second input control tuning signal.

17. The method of claim 1, wherein at least one of the varactors or at least one of the passive elements is implemented in MOS or metal semiconductor field effect transistor (MESFET) process technology.

18. A voltage controlled oscillator (VCO) apparatus comprising:
   a first pair of varactors connected together at a positive terminal of each of the first pair of varactors;
   a second pair of varactors connected together at a negative terminal of each of the second pair of varactors, wherein the second pair of varactors is connected in parallel with the first pair of varactors;
   a first input control tuning signal at the positive terminal of each of the first pair of varactors;
   a second input control tuning signal at the negative terminal of each of the second pair of varactors; and
   at least two passive elements being serially connected together, wherein the at least two passive elements comprise a common-mode reference for the first and second input tuning control signals, and wherein the at least two passive elements are connected in parallel with the first and second pairs of varactors.

19. The VCO apparatus of claim 18, further comprising:
   a tuning tank circuit connected in parallel with the first and second pairs of varactors;
   an active circuit connected in parallel with the tuning tank circuit; and
   a pair of coupling capacitors to differentially couple the first and second pair of varactors to the tuning tank circuit.

20. The VCO apparatus of claim 19, wherein the tuning tank circuit is an inductor-capacitor (LC) circuit.

21. The VCO apparatus of claim 19, wherein the tuning tank circuit is any of a ring oscillator and a reference crystal oscillator.

22. The VCO apparatus of claim 19, wherein the coupling capacitors comprise metal-insulator-metal (MIM) capacitors.

23. The VCO apparatus of claim 19, wherein the parallel connection comprises:
   a first connection for a negative terminal of a first varactor from the first pair of varactors to a positive terminal of a first varactor from the second pair of varactors; and
   a second connection for a positive terminal of a second varactor from the first pair of varactors to a positive terminal of a second varactor from the second pair of varactors, wherein a terminal for a first passive element from the at least two passive elements is connected to the first connection, and wherein a terminal for a second passive element from the at least two passive elements is connected to the second connection.

24. The VCO apparatus of claim 23, wherein the first and second connections comprise different connections from any of a first node connecting the serially connected passive elements, a second node connecting the first pair of varactors, and a third node connecting the second pair of varactors.

25. The VCO apparatus of claim 19, wherein the coupling capacitors are configured to block low frequency noise.

26. The VCO apparatus of claim 19, wherein the VCO apparatus is differential.

27. The VCO apparatus of claim 26, wherein the VCO apparatus is operable to provide common-mode noise rejection.

28. The VCO apparatus of claim 27, wherein the VCO apparatus is operable to provide noise cancellation.

29. The VCO apparatus of claim 27, wherein the VCO apparatus is operable to cancel the noise on the nodes that are connected between the first pair of varactors and the second pair of varactors.

30. The VCO apparatus of claim 27, wherein each varactor is configured to receive half of a differential voltage signal to reduce VCO sensitivity ($K_{VCO}$).

31. The VCO apparatus of claim 26, wherein the common mode reference comprises a third input control tuning signal.

32. A system comprising a voltage controlled oscillator (VCO) comprising:
   a differential varactor topology, wherein the topology comprises:
      a first pair of serially-connected varactors, wherein the first pair of varactors is connected at a positive terminal of each varactor; and
      a second pair of serially-connected varactors, wherein the second pair of varactors is connected at a negative terminal of each varactor, wherein a negative terminal of each of the first pair of varactors is connected to a positive terminal of each of the second pair of varactors; and
   a passive network to receive a common mode signal related to a first input tuning control signal applied to the positive connection at the first pair of varactors and to a second input tuning signal applied to the negative connection at the second pair of varactors;
   an oscillator device capacitively-coupled to the negative terminal of each of the first pair of varactors and the positive terminal of each of the second pair of varactors; and
   an active circuit connected to the oscillator device.

33. The system of claim 32, wherein the oscillator device comprises any of an inductor-capacitor (LC) tank, a ring oscillator, and a reference crystal oscillator.

34. The system of claim 32, wherein the connections of the first and second pairs of varactors are configured to provide common-mode noise rejection.

35. The system of claim 32, wherein the capacitive coupling is configured to provide blocking of low frequency noise.

36. The system of claim 32, wherein the first input tuning control signal and the second input tuning control signal comprise a differential signal.

37. The system of claim 32, wherein a phase-locked loop (PLL) circuit comprises the VCO.

38. The system of claim 32, wherein the VCO is configured to be implemented in CMOS technology.

39. The system of claim 32, wherein the varactors are configured to be implemented using metal-oxide semiconductor (MOS) or metal-semiconductor field effect transistor MESFET structures.

* * * * *